(12) United States Patent
Launay

(10) Patent No.: US 7,834,275 B2
(45) Date of Patent: Nov. 16, 2010

(54) SECURE ELECTRONIC ENTITY SUCH AS A PASSPORT

(75) Inventor: François Launay, Epron (FR)

(73) Assignee: Oberthur Technologies, Levallois-Perret (FR)

( * ) Notice: Subject to any disclaimer, the term of this patent is extended or adjusted under 35 U.S.C. 154(b) by 915 days.

(21) Appl. No.: 11/587,847

(22) PCT Filed: Apr. 22, 2005

(86) PCT No.: PCT/FR2005/001002
§ 371 (c)(1),
(2), (4) Date: Dec. 22, 2006

(87) PCT Pub. No.: WO2005/116920
PCT Pub. Date: Dec. 8, 2005

(65) Prior Publication Data
US 2008/0002379 A1 Jan. 3, 2008

(30) Foreign Application Priority Data
Apr. 29, 2004 (FR) .................................. 04 04568

(51) Int. Cl.
*H05K 3/28* (2006.01)
(52) U.S. Cl. .................... 174/259; 174/260; 174/521; 361/737; 361/748; 257/701; 257/783; 257/787

(58) Field of Classification Search ................. 361/736, 361/737, 749, 760, 761, 764, 748; 174/250, 174/260, 521, 259; 257/701, 783, 787
See application file for complete search history.

(56) References Cited

U.S. PATENT DOCUMENTS

| 6,049,461 | A |   | 4/2000  | Haghiri-Tehrani et al. |
| 6,049,463 | A | * | 4/2000  | O'Malley et al. ............ 361/760 |
| 6,320,753 | B1 | * | 11/2001 | Launay ....................... 361/760 |
| 6,404,643 | B1 | * | 6/2002  | Chung ........................ 361/737 |
| 6,719,205 | B1 | * | 4/2004  | Puschner et al. ............. 235/492 |
| 7,370,807 | B2 | * | 5/2008  | Buursma et al. ............. 235/492 |
| 2003/0168514 | A1 |   | 9/2003 | Rancien et al. |
| 2006/0151361 | A1 |   | 7/2006 | Launay |

FOREIGN PATENT DOCUMENTS

EP 1 102 207 5/2001
JP 2001 005933 5/2001

* cited by examiner

*Primary Examiner*—Dameon E Levi
(74) *Attorney, Agent, or Firm*—Young & Thompson

(57) ABSTRACT

A secure electronic entity comprising a support and a microcircuit having an active surface which is at least partially covered by a resin, wherein at least one distinct element masks the active surface in an at least partial manner, characterized in that the element (13) is joined to the resin (16) in a more resistant manner than to the support (11).

21 Claims, 3 Drawing Sheets

SECURE ELECTRONIC ENTITY SUCH AS A PASSPORT

The invention concerns a secure electronic entity, such as in particular a passport with an electronic security device.

There are known (for example from patent application WO 02/089052) passports comprising an electronic device constituted of an antenna and an electronic module connected to said antenna, said device most often being enclosed within the cover of the passport.

The electronic module generally comprises a microcircuit of the microprocessor type, taking the form of an integrated circuit. Connecting terminals of the microcircuit are then connected to the antenna by means of conductive members, for example of the metallic contact or wire type.

Figure 1:
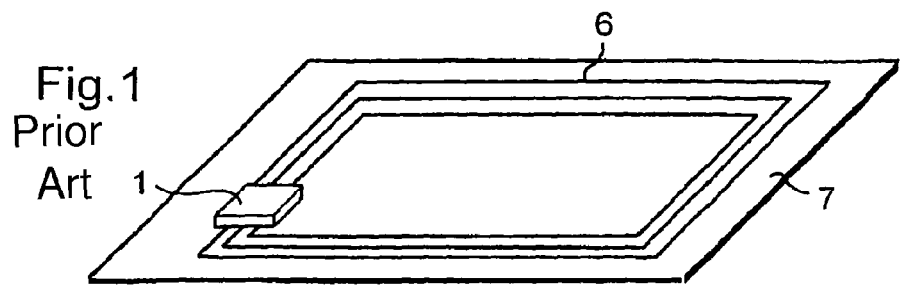
Figure 2:
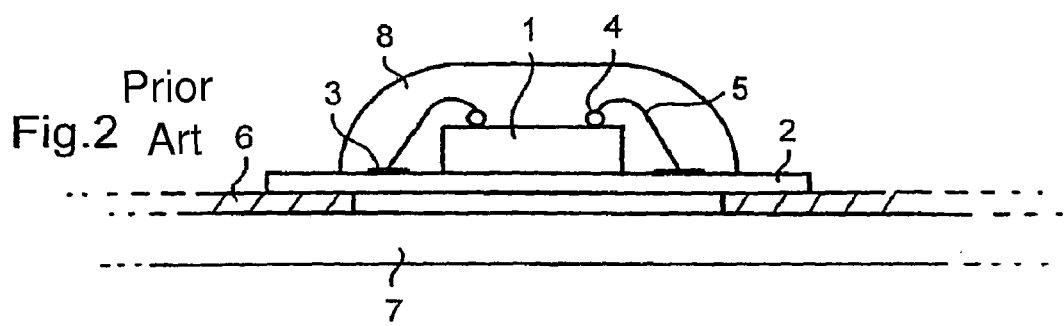

A first embodiment represented in FIGS. 1 and 2 consists in gluing the microprocessor 1 (more precisely the substrate of the integrated circuit) to a metallic grid or to a printed circuit 2. The latter supports in this case internal contacts 3 to which the contact areas 4 of the microprocessor are electrically connected via metallic wires 5 (most often of gold or aluminum), and external contacts electrically connected to the extremities of the antenna 6 formed on the internal face of the support 7 constituted by the cover of the passport. The microcircuit is in practice embedded in a coating resin 8.

Figure 3:
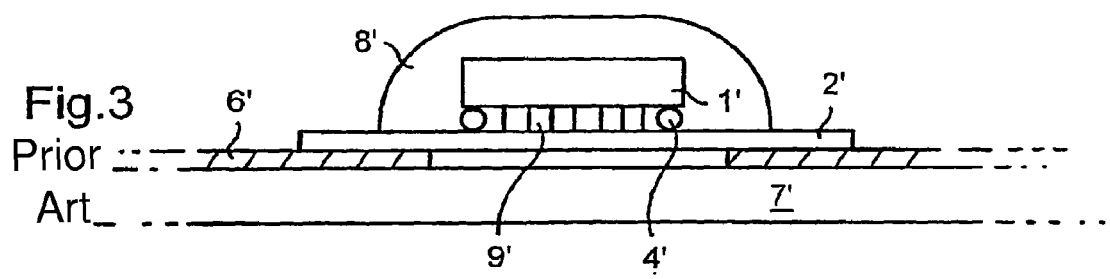

Another embodiment, represented in FIG. 3, uses a "microchip mounted upside down" or "flip-chip" technology. In this case, the contact areas of the microcircuit 1' (more precisely of the metallization areas of the integrated circuit) are provided with conductive bosses 4' and said integrated circuit is connected electrically either to the printed circuit or the support grid 2' or to the extremities of the antenna 6' carried by the support 7', through the intermediary of said conductive bosses. The integrated circuit is then fixed in a configuration in which its active face (the face that carries the electrical connection areas and the memory blocks of the integrated circuit) faces the antenna terminations or the support (printed circuit or grid). The space then situated between the active face and the printed circuit or the grid, or the space situated between the active face and the support of the antenna, is filled with a glue or some other resin 9' intended to absorb thermomechanical stresses. This glue or other resin is referred to hereinafter as "underfill".

Given the increased thickness induced by the presence of the grid 2', this FIG. 3 configuration cannot be regarded as appropriate for the fabrication of a passport.

Figure 4:
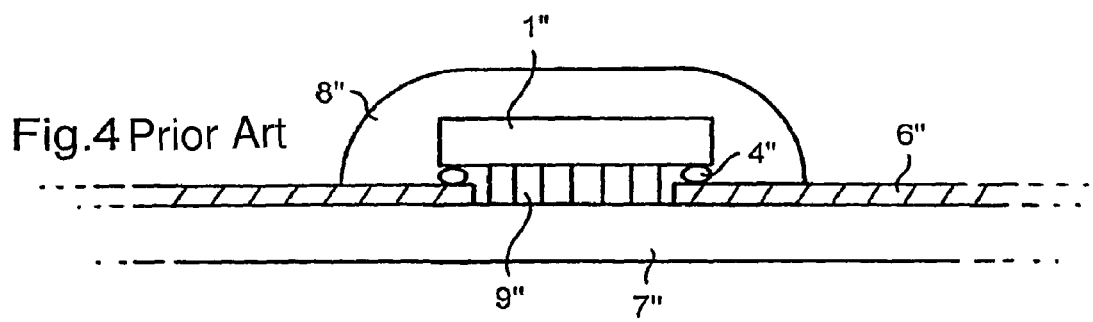

Differing in this respect from the FIG. 3 situation, there will be considered more particularly hereinafter the situation in which the microprocessor is connected directly by such flip-chip technology to the antenna terminals formed on a support such as the internal face of the cover of the passport, as shown in FIG. 4, in which items similar to those in FIG. 3 are assigned the same reference symbols except that the "prime" suffix is replaced by the "second" suffix. A protective resin 8' deposited around the lateral faces and on the substrate of the microprocessor completes the climatic and mechanical protection of the module created in this way.

The production of such devices must respond to many security rules that have been established to limit the possibility of fraudulent microchip cards and passports. Certain of these rules seek to limit the possibilities of visual access to the active face of the integrated circuit and stipulate that this face must be covered with a resin that is opaque to luminous radiation in the visible spectrum. Accordingly, if the electronic module had just been separated from its support, direct observation would not be possible without chemically dissolving or mechanically ripping off the opaque resin, which adds a further difficulty for the fraudster and increases the risk of destruction of the microprocessor.

Figure 5:
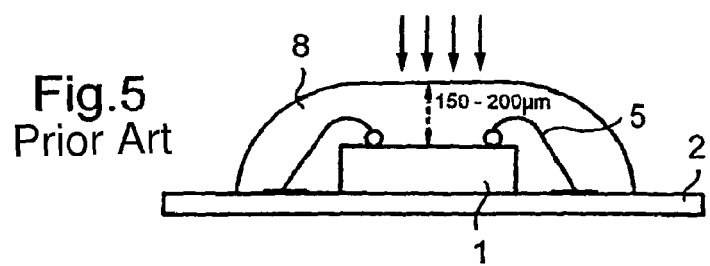

This known solution, which consists in using opaque (often black) resins to conceal the active face of the microprocessor, is particularly efficacious in the case of modules connected by soldered wires as shown in FIG. 2. In fact, the thickness of the resin, which in this case is of the order of 150 to 200 µm (microns) above the active face, is sufficient to absorb the light rays, as shown in FIG. 5.

It is nevertheless possible to envisage eliminating only a portion of the opaque resin, through a mechanical or chemical process, in order to reduce its thickness significantly, without compromising the mechanical integrity of the microprocessor. The residual thickness of opaque resin will then not enable sufficient absorption of light rays to mask the active face.

Figure 6:
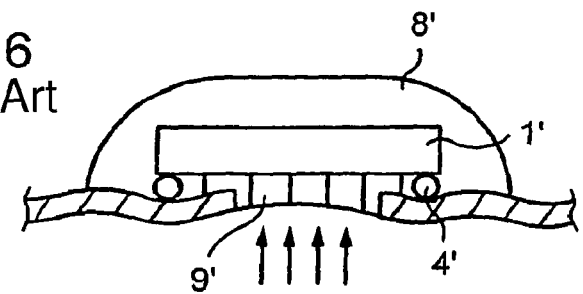

Moreover, in the case of a flip-chip type mounting, the underfill resin 9' covering the active face has a very small thickness, of the order of 20 to 50 µm. In particular, in the case of direct mounting on an antenna deposited on a paper support such as the internal face of a passport cover, there is deformation of the support under the active face of the microprocessor leaving room for only a very thin thickness of underfill, as shown in FIG. 6. Clearly it is then easier to observe the active face by transparency, the small thickness of the resin having insufficient opacity.

An object of the invention is a secure electronic entity of the microcircuit type, in particular of the "flip-chip" mounted microcircuit passport type, capable of resisting better than the solutions cited above an attempt at intrusion, in particular by mechanical aggression or by light.

In order in particular to solve these problems, the invention proposes a secure electronic entity including a support and a microcircuit having at least one active face partly covered with a resin, in which at least one distinct member masks at least a portion of the active face, characterized in that said member is more strongly joined to the resin than to the support.

At the time of a mechanical attack on the entity, for example by peeling or scraping the support, the distinct member therefore remains attached to the assembly formed by the resin and the microcircuit.

The visual masking of the active face of the microcircuit by this distinct member therefore continues to be assured even in the event of this kind of attack.

This advantage may be obtained in the configuration of FIG. 2 by disposing the masking member (in one or more parts) above the microcircuit, within the coating resin.

According to one particularly advantageous embodiment, the masking member is at least in part constituted by a conductive member in electrical contact with at least one connecting terminal of the microcircuit.

Thus a conductor is used to effect the masking of the active face the usual role whereof is to establish an electrical connection with the microcircuit.

It may nevertheless be remarked that the principle of the invention here is not, in the event of an attempt at intrusion, to interrupt the electrical connection produced by the conductor, but to the contrary to continue to prevent visual access to the active face of the microcircuit if the support is eliminated.

This solution therefore does not require that the conductor condition the internal operation of the microcircuit. It is nevertheless equally usable in this latter case.

A conductor that does not condition the internal operation of the microcircuit is for example an antenna with no feeder function or a screen (as opposed to a member connected to the power supply of the microcircuit that naturally conditions its internal operation).

The invention proposed here could nevertheless be combined with another solution for protecting the electronic entity against attacks; there could thus be provided within the "distinct masking member" other conductive members, which as for them would be easily broken in the event of a mechanical attack.

Generally speaking, according to advantageous features of the invention, where applicable combined:
- said member is at least in part constituted by two conductive members separated by a gap having a width from 100 µm to 2 mm;
- the distinct member includes at least one conductive connection member of an antenna (see above);
- the member includes two conductive terminations of an antenna that are interleaved, which provides particularly effective masking of the active face;
- the microcircuit has its face called the active face and carrying this connecting terminal oriented towards the support, which is a configuration in which the masking by conductive members is most useful;
- the resin fills a space delimited in particular by the active face and the support and preferably further delimited by said member;
- said member extends at least in part between the active face and the support;
- said member has at least in part a surface state that encourages its adhesion to the resin, which corresponds to a way to reinforce the hold between the member and the resin;
- the material of the resin is chosen to have a chemical nature closer to that of the member than that of the support, which corresponds to another way to reinforce the mechanical hold between the member and the resin, without having to provide any particular surface treatment;
- the resin and said member are joined by a mechanical anchoring, which is of course another way to reinforce the mechanical hold in question;
- the support is made from a material adapted to be impregnated with the resin, which is a simple way to provide a mechanical anchorage;
- an intermediate layer is disposed between said member and the support, said intermediate layer having an adhesion to this member or this support lower than the adhesion between the resin and this member, which is a further way to reinforce the mechanical hold between the resin and this member compared to that between the resin and the support;
- the distinct member masks at least 90% of the active face;
- said electronic entity is a microcircuit card, but may also be a passport, as mentioned above; independently of whether the entity is a passport, an identity document, or not, the support is made of paper, for example; in this case in particular it is beneficial if said member electrically connects the microcircuit to an antenna or alternatively to a contact plate.

Figure 7:
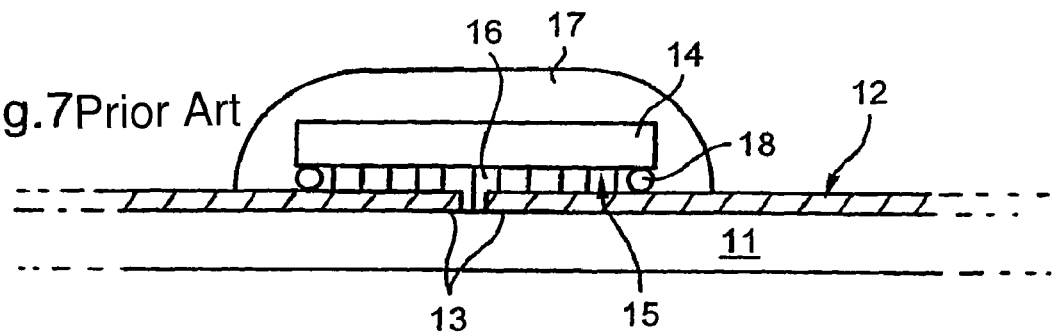
Figure 8:
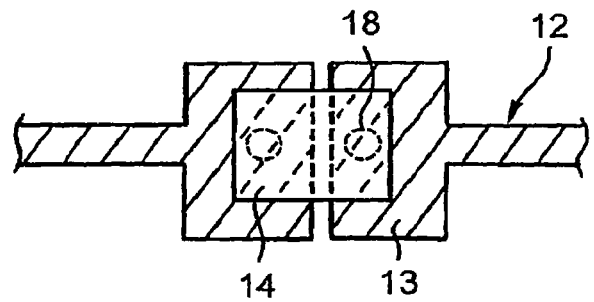
Figure 9:
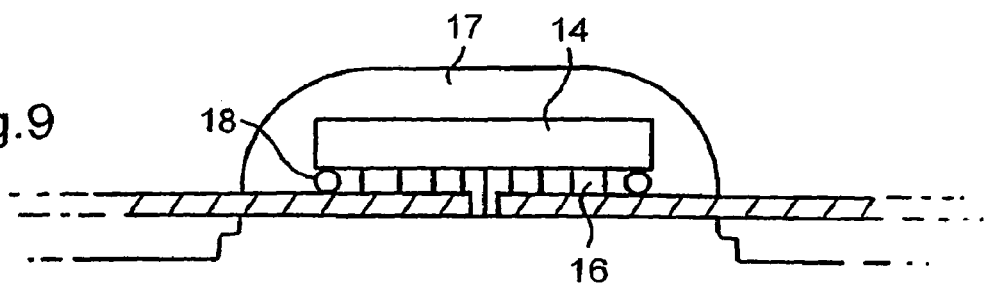
Figure 10:
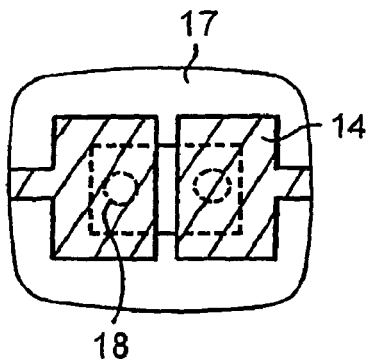
Figure 11:
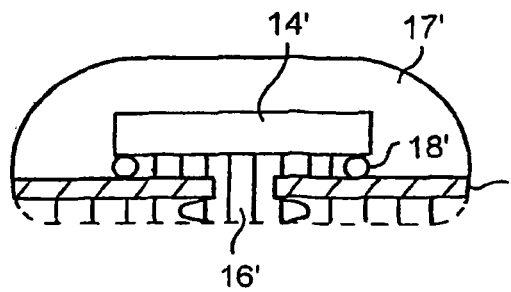
Figure 12:
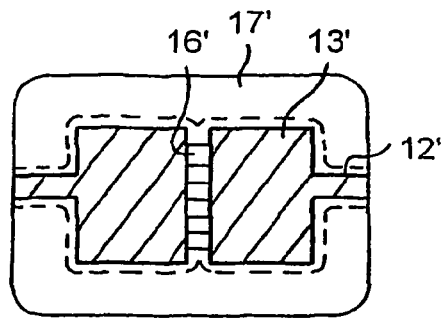
Figure 13:
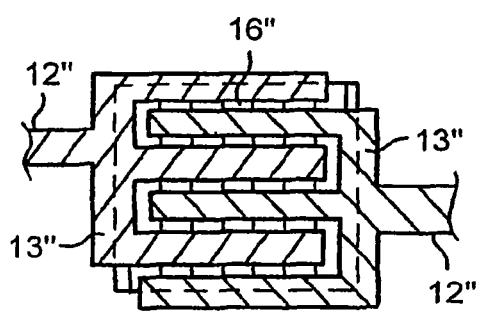
Figure 14:
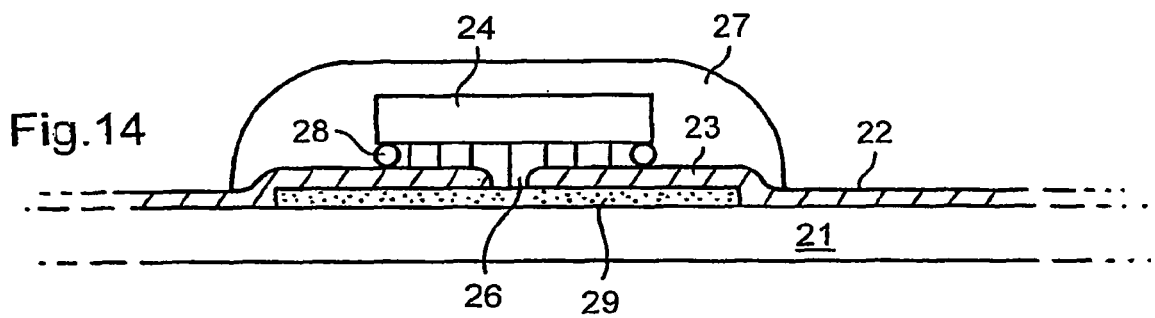
Figure 15:
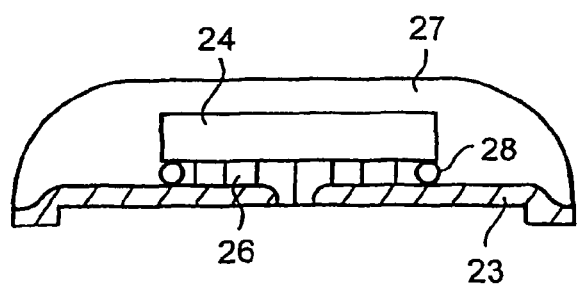
Figure 16:
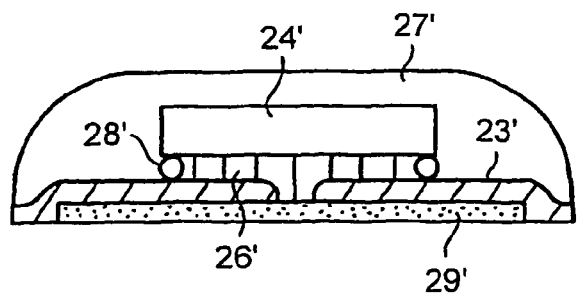

Objects, characteristics and advantages of the invention emerge from the following description, given by way of illustrative nonlimiting examples with reference to the appended drawings in which:

FIG. 1 is a perspective view of an internal face of a passport provided with an antenna and a microcircuit, in accordance with a known configuration, FIG. 2 is a view in section of the microcircuit on the support constituted by this internal face, FIG. 3 is a view in section representing a variant mounting of the microcircuit from FIGS. 1 and 2, FIG. 4 is a view in section representing a variant of FIG. 3, FIG. 5 is a view analogous to that of FIG. 2, corresponding to an attempt at intrusion, FIG. 6 is a view analogous to that of FIG. 3, corresponding to another attempt at intrusion, FIG. 7 is a view in section, analogous to that of the preceding figures, of the portion of a secure electronic entity according to the invention that includes a microcircuit, FIG. 8 is a view from above of the microcircuit, FIG. 9 is a view in section of this microcircuit, in the event of an attempt at intrusion, FIG. 10 is a view from below of this microcircuit in the event of an attempt at intrusion, FIG. 11 is a view in section, analogous to that of FIG. 9, of a torn away portion of another entity according to the invention, FIG. 12 is a view of it from below, FIG. 13 is a view from below of a masking member forming part of yet another secure electronic entity according to the invention, FIG. 14 is a view in section of yet another portion of another embodiment of the invention, FIG. 15 is a view of it in section, corresponding to an attempt at intrusion, and FIG. 16 is a view in section analogous to that of FIG. 15, corresponding to a variant embodiment of FIG. 14.

A first embodiment of the invention is represented in FIGS. 7 and 8.

According to the detailed representation of these figures, a secure entity of the microcircuit type includes a support 11, for example formed by a portion of the cardboard cover of a passport, which carries on one of its faces, preferably its internal face, an antenna 12 two terminations 13 whereof in particular are visible in the figures.

The antenna 12 is for example produced by means of a conductive ink, which may be deposited by screen printing.

A microcircuit 14, here a microprocessor, is mounted on the support 11 by a mounting of the flip-chip type, i.e. the active face 15 of the microcircuit 14 faces in the direction of the face of the support 11 that carries the antenna 12.

It is recalled that the active face is the face that includes the electrical connection areas and the functional units (for example the memory units) of the microcircuit. Visual access to this face can therefore enable a fraudster to interfere with the operation of the microcircuit, for example by subjecting it to light of high intensity (flash, laser).

This face of the support 11 and the active face 15 are therefore essentially parallel, face to face and situated at a very small distance from each other, in general at a distance of a few tens of microns.

The interstice formed in this way between the active face 15 and the support 11 is filled in part with a resin 16, called underfill resin, which thus covers, at least in part, the active face 15 of the microcircuit 14.

The microcircuit 14 and the portions of the antenna 12 that juxtapose it may furthermore be coated with an encapsulation (or protection) resin 17.

Each termination 13 of the antenna 12 is connected electrically to a connection pin (or terminal) of the microcircuit 14 by means of a conductive boss 18.

In the example represented, the terminations 13 mask a portion of the surface of the active face 15 that is sufficiently large to prevent any significant visual observation of the latter.

The masked area represents for example at least 90% of the active area. It is thus seen that these terminations 13 are here large areas, much larger than the conductors of which they constitute the extremities. The areas are, generally speaking, conformed to mask the most sensitive zones of the active surface, such as memories, in particular volatile memories of the RAM type. These large areas here have an area greater than the total area of the active face, being separated by a slot of just sufficient width, for example from 100 μm to 2 mm, to avoid a short-circuit. In a variant that is not shown, these terminations 13 have a smaller size, but a distinct masking member of these conductors is disposed facing this active face, in the same plane as the plane of the terminations 13, or in a different, for example lower, plane.

Moreover, the terminations 13 have an adhesion to the underfill resin 16 that is greater than their adhesion to the support 1. Accordingly, the terminations 13 are joined more strongly to the underfill resin 16 than to the support 11, in particular if these members are subjected to tearing off forces.

A good adhesion between the terminations 13, produced by means of conductive inks, and the underfill resin 16 is obtained by using inks and an underfill resin of similar chemical kinds, for example, whereas the chemical nature of the ink is chosen to be different from that of the material of the support 11 (generally paper or thermoplastic). Thus the use of an ink composed of solvents and resins will naturally lead to good adhesion between the ink and the underfill resins through chemical affinity.

It is to be noted that in the case of an antenna 12 of conductive ink deposited on a thermoplastic (for example PVC) support 11, the above effect is reinforced by the fact that conductive inks often adhere weakly to this type of support.

The removal of the paper support 1 from the passport, by peeling or scratching, as illustrated diagrammatically in FIGS. 9 and 10, therefore does not run the risk of tearing off the terminations 13 of the antenna 12 because the latter remain attached to the combination formed by the microcircuit 14, the underfill resin 16 and the encapsulation resin 17.

The terminations 3 of the antenna 2 thus mask visually the active face 5 of the microcircuit 4 as would a thick opaque resin, even if the support 1 is torn off. In other words, in the event of an attempt at tearing off, the masking members (here the terminations 13) remain attached to the microcircuit and thus guarantee continued masking of the active face.

It is equally possible to use an underfill that is partially absorbed by the paper support. In this case, the level of penetration of said underfill will be situated below the antenna-paper interface, thus facilitating the incorporation of the terminations of the antenna into the rigid block constituted by the integrated circuit, the underfill and the protection resin. In FIGS. 11 and 12, in which members analogous to those of FIGS. 7 to 10 are assigned the same reference symbols, but with a "prime" suffix, the underfill 16' has properties of wetting the paper forming the support 11' such that it extends over a wetting zone (delimited by dashed lines in FIG. 12) larger than the active face itself. However, this penetration may feature gradients, as is represented by curved lines in FIG. 11 delimiting a maximum penetration area near the slot separating the terminations 13'.

FIG. 13 represents a constructive detail of a variant embodiment (members analogous to those of FIGS. 7 to 10 are there assigned the same reference signs, but with a "seconds" suffix) whereby the antenna terminations 13" are moreover interleaved to enable the underfill 16", to penetrate into the interstices and attach even better said terminations to the underfill/integrated circuit 14"/protection resin 17" assembly. This reinforces the mechanical anchoring of the terminations in the underfill resin. The dashed line along certain branches of these interleaved terminations represents the microcircuit 14.

In the case of a metallic antenna in copper or aluminum, certain treatments such as CORONA discharge or LASER may be utilized on the surface of the termination in order to increase their adhesion to the underfill.

FIGS. 14 and 15 show a yet further embodiment according to which, at the same time as seeking, or not, to increase the adhesion between the antenna terminations and the underfill as indicated above, relative adhesion between the underfill 26 and the masking members 23 is encouraged by reduction of the adhesion between these masking members (the antenna terminations) and the support; members analogous to those of FIGS. 7 to 10 are assigned therein reference signs that are deduced therefrom by addition of the number 10. In this example, in a zone corresponding at least to the area contained under the surface of the microprocessor 24, there has been disposed between the support 21 and the antenna terminations 23 a layer 29 of electrically insulating material, adhering strongly to one member (the support in the example represented in FIG. 15) and weakly to the other one (the terminations in the example of FIG. 15). The layer 29 is for example obtained by means of a thermally polymerized varnish deposited on the member to which it must adhere strongly (the support in FIG. 15). In the event of an attempt at tearing off, the material 29 will be eliminated with the support in the example represented in FIG. 15.

In a variant represented in FIG. 16 (members analogous to those of FIGS. 14 and 15 are therein assigned the same reference symbols, but with a "prime" suffix), the material of the layer 29' will remain attached to the antenna terminations 23'.

However, in both cases, the layer 29 or 29' will enable detachment of the antenna terminations 23 from the support rather than from the underfill.

In another variant, the layer 29 of electrically insulating material from FIG. 14 is produced with a low adhesion as much to the antenna terminations 23 as to the support 21, since in this case also the connection between the antenna terminations 23 and the support 21 is less strong than the connection between the antenna terminations 23 and the underfill 26.

The invention is not limited to the embodiments that have just been described. For example, the electronic entity may be a microcircuit card; in this context, FIG. 7 may be seen as the structure of the inlay of a microcircuit card.

The invention claimed is:

1. Secure electronic entity including a support and a microcircuit having an active face at least in part covered by a resin, wherein at least one distinct member masks at least in part the active face, characterized in that said member (13, 13', 23, 23') is joined more strongly to the resin (16, 16', 26, 26') than to the support (11, 11', 21), wherein said distinct member is conformed to mask the most sensitive zones of the active surface.

2. Secure electronic entity according to claim 1, characterized in that said member is at least in part constituted by a conductive member (13, 13', 13", 23, 23') in electrical contact with at least one connecting terminal of the microcircuit (14, 14', 24, 241).

3. Secure electronic entity according to claim 2, characterized in that said member is at least in part constituted by two conductive members (13, 13', 13", 23, 23') separated by a gap having a width from 100 μm to 2 mm.

4. Electronic entity according to claim 2, characterized in that the distinct member includes at least one conductive connection member (13, 13', 13", 23, 23') of an antenna.

5. Electronic entity according to claim 4, characterized in that the member includes two conductive terminations (13") of an antenna that are interleaved.

6. Electronic entity according to claim 1, characterized in that the microcircuit has its face called the active face and carrying this connecting terminal oriented towards the support.

7. Electronic entity according to claim 6, characterized in that the resin fills a space delimited in particular by the active face and the support.

8. Electronic entity according to claim 7, characterized in that the space filled by the resin is further delimited by said member.

9. Electronic entity according to claim 8, characterized in that said member extends at least in part between the active face and the support.

10. Electronic entity according to claim 1, characterized in that said member has at least in part a surface state that encourages its adhesion to the resin.

11. Electronic entity according to claim 1, characterized in that the material of the resin is chosen to have a chemical nature closer to that of the member than that of the support.

12. Electronic entity according to claim 1, characterized in that the resin and said member are joined by a mechanical anchoring.

13. Electronic entity according to claim 12, characterized in that the support is made from a material adapted to be impregnated with the resin.

14. Secure electronic entity including a support and a microcircuit having an active face at least in part covered by a resin, wherein at least one distinct member masks at least in part the active face, characterized in that said member (13, 13', 23, 23') is joined more strongly to the resin (16, 16', 26, 26') than to the support (11, 11', 21), and an intermediate layer (29, 29') is disposed between said member and the support, said intermediate layer having an adhesion to this member or this support lower than the adhesion between the resin and this member.

15. Secure electronic entity including a support and a microcircuit having an active face at least in part covered by a resin, wherein at least one distinct member masks at least in part the active face, characterized in that said member (13, 13', 23, 23') is joined more strongly to the resin (16, 16', 26, 26') than to the support (11, 11', 21), wherein the distinct member masks at least 90% of the active face.

16. Electronic entity according to claim 1, characterized in that said electronic entity is a microcircuit card.

17. Electronic entity according to claim 1, characterized in that the support is made essentially of paper.

18. Electronic entity according to claim 1, characterized in that said electronic entity is a passport.

19. Electronic entity according to claim 16, characterized in that said member electrically connects the microcircuit to an antenna.

20. Electronic entity according to claim 3, characterized in that the distinct member includes at least one conductive connection member (13, 13', 13", 23, 23') of an antenna.

21. Secure electronic entity including a support and a microcircuit having an active face at least in part covered by a resin, wherein at least one distinct member masks at least in part the active face, characterized in that said member (13, 13', 23, 23') is joined more strongly to the resin (16, 16', 26, 26') than to the support (11, 11', 21), wherein said distinct member is conformed to mask memory units included in the active surface.

* * * * *